(12) United States Patent
Park et al.

(10) Patent No.: US 6,518,508 B2
(45) Date of Patent: Feb. 11, 2003

(54) AG-PRE-PLATED LEAD FRAME FOR SEMICONDUCTOR PACKAGE

(75) Inventors: Se-Chul Park, Changwon (KR); Nam-seog Kim, Cheonan (KR)

(73) Assignees: Samsung Techwin Co., Ltd. (KR); Samsung Electronics Co., Ltd. (KR)

( * ) Notice: Subject to any disclaimer, the term of this patent is extended or adjusted under 35 U.S.C. 154(b) by 0 days.

(21) Appl. No.: 09/878,341

(22) Filed: Jun. 12, 2001

(65) Prior Publication Data

US 2002/0104682 A1 Aug. 8, 2002

(30) Foreign Application Priority Data

Dec. 8, 2000 (KR) .......................................... 2000-74793

(51) Int. Cl.⁷ ................................................ H05K 1/03
(52) U.S. Cl. ...................... 174/255; 174/256; 361/723; 361/813; 257/677; 428/209
(58) Field of Search ................................ 174/255, 256, 174/260; 361/723, 760, 771, 779, 809, 813; 257/673, 676, 677, 784, 666, 762; 428/209

(56) References Cited

U.S. PATENT DOCUMENTS

| | | | |
|---|---|---|---|
| 5,510,197 A | * 4/1996 | Takahashi et al. | 428/670 |
| 5,684,329 A | * 11/1997 | Serizawa | 257/677 |
| 5,710,456 A | * 1/1998 | Abbott et al. | 257/666 |
| 5,728,285 A | * 3/1998 | Mathew | 205/182 |
| 5,889,317 A | * 3/1999 | Huang et al. | 257/666 |
| 5,929,511 A | * 7/1999 | Nakazawa et al. | 257/666 |
| 6,150,711 A | * 11/2000 | Kom et al. | 257/677 |

FOREIGN PATENT DOCUMENTS

| | | | |
|---|---|---|---|
| JP | 359168659 A | * | 9/1984 |
| JP | 403283556 A | * | 12/1991 |
| JP | 411008340 A | * | 1/1999 |

OTHER PUBLICATIONS

SMTA, Jun. 13, 14, 2000, Boston, Massachusetts "A Symposium on Lead Free Interconnect Technology, Proceedings of the Technical Program" (pp. 115–120).

* cited by examiner

Primary Examiner—David L. Talbott
Assistant Examiner—J B Patel
(74) Attorney, Agent, or Firm—St. Onge Steward Johnston & Reens LLC

(57) ABSTRACT

A lead frame for a semiconductor package includes a base metal layer made of copper (Cu), Cu alloy or iron-nickel (Fe-Ni) alloy, an underlying plating layer formed on at least one surface of the base metal layer and made of Ni or Ni alloy, an intermediate plating layer formed on the underlying plating layer to a thickness of about 0.00025 to about 0.1 μm (about 0.1 to about 4 microinches) and made of palladium (Pd) or Pd alloy, and an outer plating layer formed in the intermediate plating layer to a thickness of about 0.05 to about 0.75 μm (about 2 to 30 microinches) and made of silver (Ag) or Ag alloy. Since an Ag plated layer is formed as the outer plating layer, excellent oxidation resistance and corrosion resistance can be exhibited even under a high-temperature thermal condition, thereby improving wire bondability, solderability and good adhesion with epoxy for use in the semiconductor package, and preventing heel crack at a wire bonding portion. In particular, since thin layers of the Pd plated layer and Ag plated layer are used, Ag migration can be prevented. Also, the amount of a noble metal such as Pd or Ag can be greatly reduced, thereby attaining thin-film, light-weight semiconductor packages.

11 Claims, 6 Drawing Sheets

AG-PRE-PLATED LEAD FRAME FOR SEMICONDUCTOR PACKAGE

BACKGROUND OF THE INVENTION

1. Field of the Invention

The present invention relates to a lead frame for a semiconductor package, and more particularly, to a lead frame for a semiconductor package which can maintain a high quality of the package under a high-temperature environment even if a plating layer is thin, can prevent migration of silver (Ag) due to a reduction in the thickness of an Ag-plated layer, and can reduce the manufacturing cost.

2. Description of the Related Art

A semiconductor lead frame basically includes a die pad unit for mounting a semiconductor memory chip and fixing the same at a static state, an inner lead connected to the chip by wire bonding, and an outer lead for connection with an external circuit. The wire-bonded chip and the wire-bonded inner lead are hermetically sealed by a molding compound to form a semiconductor package. The semiconductor lead frame having the aforementioned configuration is generally manufactured by a stamping process or an etching process.

In such a lead frame for a semiconductor package, in order to maintain good wire bondability in an inner lead and good adhesion between a pad and a chip, a metal material such as silver (Ag) is plated on the pad and the tip of the inner lead of the lead frame. Also, after resin passivation film molding, in order to improve solderability during mounting an outer lead connected to an external circuit board, solder plating, that is, tin-lead (Sn–Pb) plating, is performed on a predetermined region of the outer lead. However, since the plating is generally performed in a wet process after resin passivation film molding, a Sn—Pb plating solution soaks through a gap between epoxy and lead, which degrades the reliability of completed products. In order to solve this problem, a pre plating method (pre plated frame) has been proposed. In the pre plated frames, prior to semiconductor packaging, a metal having excellent wire bondability, chip adhesion and solder wettability is pre plated on a metal material, thereby omitting a lead plating step during a semiconductor post packaging process. Thus, since use of the pre plated lead frames simplifies the semiconductor post packaging process and environmental contamination due to lead plating can be reduced, much attention has recently been paid to the pre plated frames.

Considering that a semiconductor assembling process including semiconductor chip adhesion, wire bonding, epoxy molding, soldering and the like, is generally performed at a high temperature of 200° C. or higher, the kind of an outer plating layer is quite an important factor in manufacturing a lead frame by a preplating method. Requirements for an outer plating layer of a lead frame manufactured by a pre plating method include oxidation resistance at a higher temperature, good bondability with a bonded wire used in wire bonding, good adhesion with a chip, generally made of silicon, good moldability with an epoxy resin which is a molding material, good fusibility with lead during soldering. In addition, in order to prevent abrasion of a bonding capillary during wire bonding, the outer plating layer should be made of metal having adequate ductility. The long-term reliability of a semiconductor device must be ensured, without short-circuiting due to diffusion of plated metal in the outer layer into a medium in contact therewith under hot and humid conditions for a long period of time, which is so-called "migration." The outer plating layer material satisfying the requirements is a noble metal such as palladium (Pd), gold (Au) or silver (Ag). Specifically, Au and Ag have been conventionally preferred due to their excellent conductivity and ductility. In the case of using Au, 0.5 to 2 μm thick Au is preferably plated. In the case of using Ag, 1 to 5 μm thick Ag is preferably plated. However, as a semiconductor package has recently been miniaturized and highly integrated, Pd, which has a denser structure and which does not cause migration, has gained more attention as an outer plating layer material than Au or Ag causing migration.

However, in the case of plating the noble metal, in order to maintain flatness of a plating layer and to reduce the amount of a noble metal used, an underlying plating layer made of a metal having a good plating adhesion strength to the material to be plated thereon, is first formed and noble metal plating is then performed on the underlying plating layer. Here, nickel (Ni) is widely used as a material of the underlaying plating layer.

FIGS. 1 through 4 show the structure of a plating layer of a conventional semiconductor lead frame based on a pre plated method.

First, FIG. 1 shows a cross-section of a conventional semiconductor lead frame disclosed in Japanese Patent No. 1,501,723, directed to a lead frame for a plastic package in which a Ni underlying plating layer 12 is formed on a chip mount section and a lead frame surface 11 of a wire bonding section, and a plating layer 13 made of a Pd or Pd alloy is formed as an outer layer. In one embodiment of this patent, 0.1 to 1 μm thick Pd plated layer is formed on Ni plated layer, 0.1 to 1 μm thick. According to this patent, in the case of thickly plating Au or Ag as the outer layer (Au: 0.5 to 2 μm; Ag: 1 to 5 μm), the migration problem can be prevented.

Pd has a very dense structure and is a very hard metal. Further, when the outer layer is made of Pd, it is likely to be oxidized in the course of a high temperature semiconductor packaging process. Thus, the plating layer gets harder and the melting point thereof gets higher, thereby lowering solderability and causing wearing or damage of a wire bonding capillary. Also, since Pd is a metal having a hydrogen embrittlement, it is combined with hydrogen when exposed to the atmosphere, resulting in brittleness of the plating layer.

FIG. 2 shows a cross section of a conventional semiconductor lead frame disclosed in Japanese Patent No. 2,543,619, which is proposed for overcoming the problems with the structure disclosed in Japanese Patent No. 1,501,723, and in which there is provided a lead frame for a semiconductor device having a plurality of metal coated layers on a copper (Cu) or Cu alloy layer, wherein a Ni underlying plating layer 22 is disposed on the Cu or Cu alloy layer 21, a 0.3 μm or less thick Pd or Pd alloy layer is 23 is entirely formed thereon and 0.001 to 0.1 μm thick Au plated layer 24 is formed on the Pd or Pd alloy layer on an outer lead of the lead frame.

However, in the case where the semiconductor lead frame having the stacked structure shown in FIG. 2 is applied to a semiconductor package requiring high reliability, the following problems may occur. First, a lead frame having an Au plated layer as the outer plating layer is comparatively weaker than the lead frame having an Ag outer plating layer in view of adhesion of a wire bonding portion, so that cracks are generated at the wire bonding portion after packaging the semiconductor device, causing product defects such as short-circuiting. This is due to repeated thermal shock applied to a lead frame having relatively weaker molding adhesion, causing repetition of feeble fluctuation between the mold portion and a lead frame bonding surface and generating fatigue therefrom. Further, the cracks generated due to fatigue may result in short-circuiting. As described above, repetition of contraction and expansion, due to repeated thermal stress, generates cracks at the interface between a mold and a lead frame or cutting of a wire bonding portion, which is called a "heel crack." Crack resistance tests were carried out for the lead frame having the above-described structure, and the results thereof showed that cracks were generated at 600 TC. cycles or below, as will be described in Comparative Example 1, which is very poor compared to the crack resistance in the case of using Ag as the outer plating layer, in which cracks were generated at over 1000 TC. cycles. Thus, the semiconductor product having the aforementioned structure has a problem in attaining long-term reliability.

Another example of a conventional pre plated lead frame is disclosed in U.S. Pat. No. 4,529,667, shown in FIG. 3.

Referring to FIG. 3, an underlying plating layer 32 made of Ni is stacked on a metal substrate 31 made of Cu or Cu alloy to a thickness of 0.1 to 5 gm. A 0.01 to 2 μm thick intermediate plating layer 33 made of Sn, Pd, Ru, Cd or alloys thereof is formed on the underlying plating layer 32. A 1 to 3 μm outer plating layer 34 made of Ag or Ag alloy is then formed on the intermediate plating layer 33.

However, since the lead frame having the above-described stacked structure has an overly thick intermediate plating layer made of Pd or Pd alloy, cracks may generate at a lead bent portion. Also, the overall thickness of the plating layers formed on the metal substrate totals 1.11 to 10 μm. In consideration of the current trend for multi pin, light-weight lead frames, the thickness of each plating layer and the overall thickness of various plating layers become excessive. Thus, when the aforementioned lead frame is applied to a multi pin device having more than 100 pins, the following problem may be generated.

In other words, in the case where the Ag plated layer is thick, the chip reliability is lowered due to migration of Ag plated under hot and humid conditions after semiconductor packaging. Also, excessive use of expensive noble metal, Pd or Ag, increases the manufacturing cost of the lead frame.

In the lead frames having the structures shown in FIGS. 1 through 3, plating layers such as a Ni plated layer, a Pd plated layer, an Ag plated layer or an Au plated layer are generally plated using a direct-current (DC) current method. However, if the Pd, Ag or Au plated layer is formed by the DC current method, the ductility of the plating layer may deteriorate, so that it is highly probable to generate cracks during formation. Also, a thickness deviation may be generated due to nonuniform plating speeds. Thus, if the thickness of a plating layer is reduced to 1 μm (4 microinches) or less, the interface inhomogeneity becomes severe so that the plating layer cannot function as an oxidation stopping layer. Thus, the intermediate plating layer or metal substrate may be oxidized during high-temperature semiconductor packaging, or metallic elements may diffuse into the surface to then be oxidized in the air, thereby generating bending cracks or lowering the solderability of the lead frame. To prevent these problems, the plating layer may be formed thickly or post treatment such as annealing may be performed, which increases, however, the manufacturing cost of the lead frame.

FIG. 4 shows the stacked structure of another conventional lead frame, disclosed in U.S. Pat. No. 6,150,713 by the applicant of the present invention. Referring to FIG. 4, a Ni plated layer 42 made of Ni or Ni alloy is formed on a metal substrate 41, a protection layer 43 plated with at least one metal among Pd, Au, Ag and alloys thereof is formed on the Ni plated layer 42 to a thickness of 0.025–0.05 μm (0.01 to 1.5 microinches). The protection layer 43 is formed by submerging the metal substrate having the Ni plated layer formed thereon, into a plating bath having a plating solution containing at least one among Pd, Au, Ag and alloys thereof and then applying a modulated current to the plating bath.

If the lead frame having the above-described stacked structure, that is, the lead frame having the protection layer having the aforementioned thickness and component, is applied to a semiconductor packaging process performed at 150 to 300° C., the following problems are involved. First, in the case of a Pd protection layer, wire bondability and solderability are lowered due to thermal oxidation of the surface layer at a high temperature condition. In the case of an Au protection layer having relatively weak molding adhesion, when it is applied to a packaging process requiring high-level reliability to be subjected to repeated thermal loads, feeble fluctuation occurs between mold-bonding portions. Thus, there is a high probability of generating heel crack at a wire bonding portion. Also, in the case of an Ag protection layer, it is difficult to directly plate Ag on a Ni underlying plating layer. Even if Ag is directly plated, adhesion between the Ag protection layer and the Ni plated layer is poor, thereby unavoidably lowering the wire bondability.

SUMMARY OF THE INVENTION

To solve the above problems, it is an object of the present invention to provide a lead frame for a semiconductor package, which can improve the characteristics of various plating layers in such a manner that an underlying plating layer made of a Ni or Ni alloy is formed on the lead frame, an outer plating layer made of Ag or Ag alloy having excellent physical property as a pre plated lead frame material is then formed, an intermediate plating layer made of Pd or Pd alloy is formed between the underlying plating layer and the outer plating layer, which can improve the solderability, wire bondability and epoxy adhesion of the pre plated lead frame by reducing the thicknesses of the plating layers, which can reduce generation of cracks at the plating layers and migration of silver during product formation, and which can greatly reduce the manufacturing cost.

It is another object of the present invention to provide a method for manufacturing a lead frame for a semiconductor package.

To achieve the first object of the present invention, there is provided a lead frame for a semiconductor package including a base metal layer made of copper (Cu), Cu alloy or iron-nickel (Fe-Ni) alloy, an underlying plating layer formed on at least one surface of the base metal layer and made of Ni or Ni alloy, an intermediate plating layer formed on the underlying plating layer to a thickness of about 0.00025 to about 0.1 gm (about 0.1 to about 4 microinches) and made of palladium (Pd) or Pd alloy, and an outer plating layer formed in the intermediate plating layer to a thickness of about 0.05 to about 0.75 μm (about 2 to about 30 microinches) and made of silver (Ag) or Ag alloy.

According to another aspect of the present invention, there is provided a lead frame for a semiconductor package including a base metal layer made of copper (Cu), Cu alloy or iron-nickel (Fe-Ni) alloy, an underlying plating layer formed on at least one surface of the base metal layer and made of Ni or Ni alloy, an intermediate plating layer formed on the underlying plating layer to a thickness of about 0.00025 to about 0.1 μm (about 0.1 to about 4 microinches) and made of palladium (Pd) or Pd alloy, and an outer plating layer formed in the intermediate plating layer to a thickness of about 0.05 to about 0.75 μm (about 2 to about 30 microinches) and made of silver (Ag) or Ag alloy, wherein the intermediate plating layer is formed by applying a modulated current to a plating bath.

To achieve the second object of the present invention, there is provided a method for manufacturing a lead frame for a semiconductor package including the steps of a) providing a base metal layer, b) pre treating the base metal layer, c) forming an underlying plating layer made of Ni or Ni alloy on the base metal layer, d) forming an intermediate plating layer by submerging the resultant structure of the step c) into a plating bath containing Pd or Pd alloy and applying a modulated current having a frequency band of about 1000 to about 20000 Hz and a duty cycle of about 5 to about 45% and a mean current density of about 0.1 to about 3 A/dM$^2$ (amperes per square decimeter) to a plating bath, and e) forming an outer plating layer made of Ag or Ag alloy on the intermediate plating layer.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Figure 1:
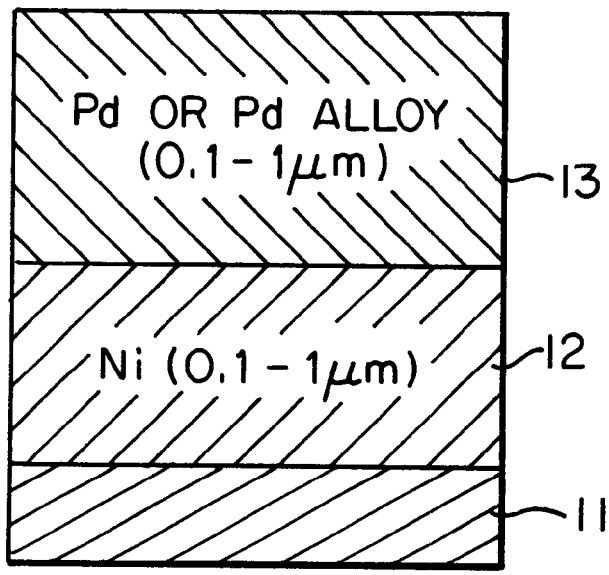
FIGS. 1 through 4 are cross-sectional views of conventional semiconductor lead frames.
Figure 2:
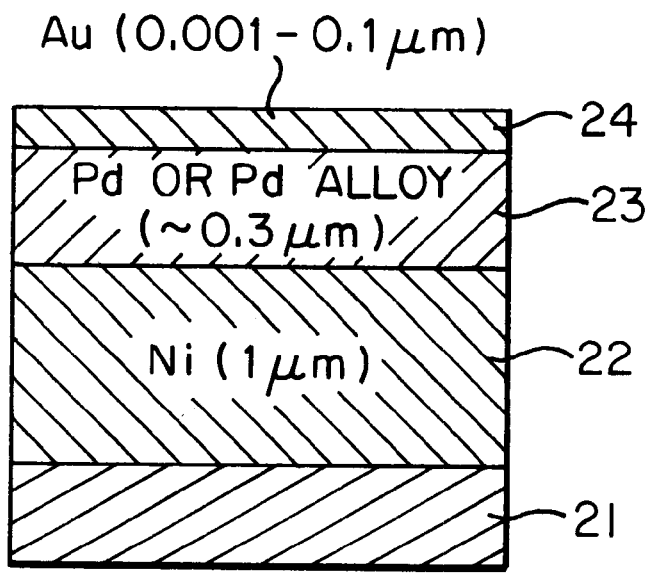
Figure 3:
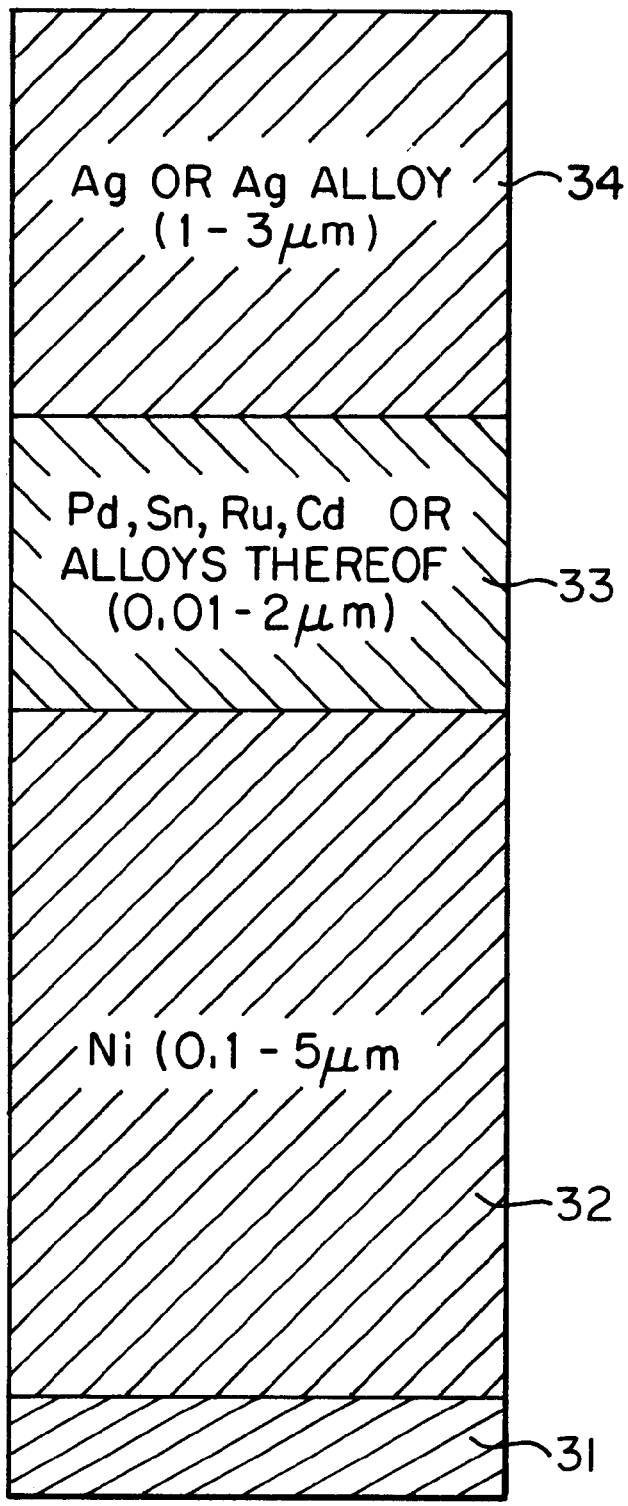
Figure 4:
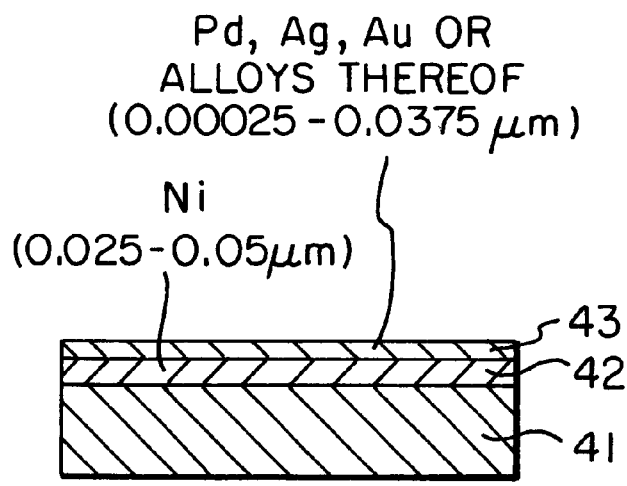
Figure 5:
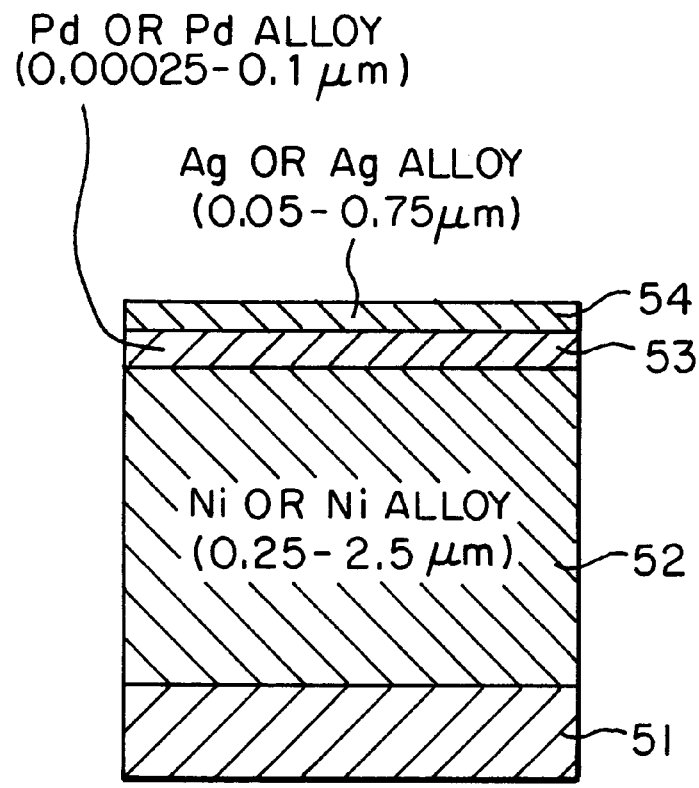
FIG. 5 is a cross-sectional view of a semiconductor lead frame according to the present invention.

FIG. 5 shows a stacked structure of a lead frame according to the present invention.

Referring to FIG. 5, an underlying plating layer 52 made of Ni or Ni alloy is formed on a base metal layer 51. Here, the thickness of the underlying plating layer 52 is preferably about 0.25 to about 2.5 μm. An intermediate plating layer 53 made of Pd or Pd alloy is formed on the underlying plating layer 52 to a thickness of about 0.00025 to about 0.1 μm (about 0.01 to about 4 microinches). An outer plating layer 54 made of Ag or Ag alloy is formed on the intermediate plating layer 53 to a thickness of about 0.05 to about 0.75 μm.

Here, the underlying plating layer 52 is made of Ni or Ni alloy. Preferably, the Ni alloy consists of about 80 to about 99.999 wt. % of Ni and about 0.001 to about 20 wt. % of phosphorus (P). The underlying plating layer 52 functions to support a soldered structure by being fused with soldering components during soldering and to maintain the flatness of upper plating layers while increasing adhesion between upper plating layers and the base metal of the lead frame. Also, the underlying plating layer 52 prevents oxidation of the base metal layer 51 and prevents oxide formation due to diffusion of metallic elements of the base metal layer 51.

The thickness of the underlying plating layer 52 is preferably about 0.25 to about 2.5 μm. If the thickness of the underlying plating layer 52 is less than about 0.25 μm, it is difficult for the underlying plating layer 52 to serve as an underlying metal layer. If the thickness of the underlying plating layer 52 is greater than about 2.5 μm, cracks may be generated during formation in the course of a semiconductor assembling process.

When the underlying plating layer 52 is formed using Ni or Ni alloy, plating can be performed by a general DC current method. However, in order to form a thin underlying plating layer having excellent adhesion with the base metal layer 51 and excellent ductility, plating is preferably performed using a modulated current. Use of the modulated current increases a current efficiency by intermittently supplying current, thereby desirably coating the plating layers uniformly. In the case of electroplating Ni or Ni alloy using a modulated current, the modulated current preferably has a frequency band of about 100 to about 20000 Hz and a duty cycle of about 5 to about 80%. Also, current pulses having a mean current density of about 15 to about 35 A/dM$^2$ is preferably used.

The intermediate plating layer 53 is formed on the underlying plating layer 52 made of Ni or Ni alloy. The intermediate plating layer 53 is made of Pd or Pd alloy. Here, the Pd alloy may consist of about 80 to about 99.999 wt. % of Pd and about 0.001 to about 20 wt. % of at least one alloying element, wherein said alloying element is Au, Ag, Ru, Ni or P. In the case of using the Pd alloy, the plating quality of the final product is similar to the case of using a single metal of Pd. However, a Pd alloy plating bath is more expensive than a Pd plating bath and it is necessary to maintain a constant alloy ratio, resulting in a complicated process control, which makes it difficult to achieve mass production. Therefore, Pd is more preferably used than Pd alloy.

The intermediate plating layer 53 made of Pd or Pd alloy is well adhered to the underlying plating layer 52 made of Ni or Ni alloy and is also well adhered to the outer plating layer 54 made of Ag or Ag alloy. Also, the intermediate plating layer 53 prevents metal components of the base metal layer 51 and the underlying plating layer 52 from being diffused into the surface to avoid oxidation and assists the outer plating layer 54 in maintaining the intrinsic quality as an Ag plated layer even under the high temperature thermal condition, thereby making the outer plating layer thinner.

The appropriate thickness of the intermediate plating layer 53 is in the range of about 0.00025 to about 0.1 μm. If the thickness of the intermediate plating layer 53 is less than about 0.00025 μm, the intermediate plating layer 53 cannot sufficiently cover the underlying plating layer 52. Thus, it is difficult for the intermediate plating layer 53 to function as an intermediate plating layer. On the other hand, if the thickness of the intermediate plating layer 53 is greater than about 0.1 μm, the quality improving effect resulting from an increase of the thickness, is negligible, only increasing the product cost. Also, the melting point of Ag as a material of the outer plating layer 54 is so low that Ag is easily melted, whereas Pd which is a material of the intermediate plating layer 54 is not relatively melted. If the intermediate plating layer 53 becomes thicker so as to exceed the range, only the Ag plated layer which is the outer plating layer is melted, resulting in deterioration of solder wettability of the lead.

Figure 6A:
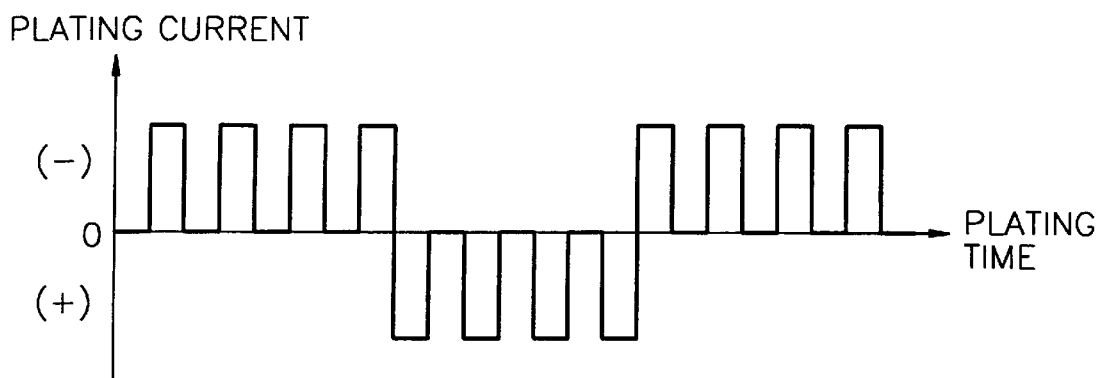
FIGS. 6A through 6E are graphs showing the waveform of a modulated current applied in the course of a plating process in the manufacture of the semiconductor lead frame according to the present invention.

In order to form a dense, defectless intermediate plating layer having excellent adhesion between the underlying plating layer 52 and the outer plating layer 54 and having excellent ductility, Pd or Pd alloy is preferably plated using a modulated current. Then, the quality of a plating layer can be improved by adjusting the generation, growth direction and speed of a Pd plated layer by intermittently supplying current. Preferred examples of the modulated current which can be used in forming the intermediate plating layer 53 made of Pd or Pd alloy, include a square wave pulse current in which a constant number of pulse waves are repeated and a constant number of inversion pulses are repeated as shown in FIG. 6A, a square wave pulse current whose polarity is periodically inverted at predetermined time intervals as shown in FIG. 613, a square wave pulse current whose polarity is inverted as shown in FIG. 6C, a square wave pulse current in which a pulse current having a predetermined period is repeated with a predetermined time of delay without polarity inversion, as shown FIG. 6D, and a square wave pulse current in which a pulse is repeated with a short time of delay and whose polarity is periodically inverted as shown in FIG. 6E.

Preferably, the modulated current applied to the plating bath containing Pd or Pd alloy during formation of the intermediate plating layer 53 has a frequency band of about 1000 to about 20000 Hz, a duty cycle of about 5 to about 45% and a mean current density of about 0.1 to about 3 $A/dM^2$.

The reason for adjusting the frequency band and the duty cycle to be about 1000 to about 20000 Hz and about 5 to about 45%, respectively, is to adjust the current intermittence period to a higher speed, thereby suppressing generation of hydrogen, controlling the growth direction of a plating layer, uniformly forming the plating layer, and preventing structural defects. The thus-formed intermediate plating layer can be made into a thin film while achieving excellent product quality. However, if the frequency band is about 1000 Hz or below and the duty cycle is greater than about 45%, the above-described effects cannot be expected to be achieved. If the frequency band is over about 20000 Hz and the duty cycle is less than about 5%, existing rectifiers cannot ensure equipment stability, lacking practicability.

The mean current density is a factor affecting the plating speed. Preferably, the mean current density ranges about 0.1 to about 3 $A/dM^2$. As the current density is smaller, the uniformity of plated particles increases. However, if the current density is less than about 0.1 $A/dM^2$, the plating speed is low. If the current density is greater than about 3 $A/dM^2$, the growth speed of plated particles is somewhat increased, occurrence of uniform nucleus growth is highly probable, so that it is difficult to form a high-quality, defectless Pd plated layer enough to function as an intermediate plating layer.

The outer plating layer 54 is made of Ag or Ag alloy. The Ag alloy consists of about 80 to about 99.999 wt. % of Ag and about 0.001 to about 20 wt. % of at least one alloying element, wherein said alloying element is Pd, Au, Ru, Ni or P. The outer plating layer 54 made of Ag or Ag alloy protects plating layers stacked under the same, thereby maintaining the quality of the plating layers. Thus, owing to the intrinsic properties of Ag, even under a high-temperature semiconductor assembling condition, the outer plating layer 54 which is a thin film having a thickness of about 0.05 to about 0.75 µm can maintain appropriate corrosion resistance and excellent wire bondability, molding adhesion and solderability. If the thickness of the outer plating layer 54 made of Ag or Ag alloy is less than about 0.05 µm, the molding adhesion becomes weaker and the oxidation preventing effect of underlying layers is negligible. To solve this problem, the intermediate plating layer should become thicker. If the thickness of the outer plating layer 54 is greater than about 0.75 µm, epoxy adhesion, solderability and wire bondability are improved. However, in this case, a possibility of generating Ag migration is high, resulting in deterioration of long-term reliability of a semiconductor device. Also, in consideration of a cost rise due to an increase in the thickness, the quality improving effect is undesirably negligible.

The outer plating layer 54 can be formed using a modulated current, like the intermediate plating layer 53. However, if the intermediate plating layer 53, that is, the Pd plated layer, is formed densely, existence of an Ag plated layer having an appropriate thickness can prevent oxidation of underlying plating layers to an extent. Thus, if only the thickness requirement is satisfied, the outer plating layer 54 can also be formed by a general DC current method. Here, the mean current density is preferably about 1 to about 5 $A/dM^2$, which is obtained in consideration of the plating speed of base metal or intermediate metal and the conditions of the plating bath since underlying plating, intermediate plating and outer plating are performed in a single line according to a general reel-to-reel plating method.

As described above, if the thicknesses of the underlying plating layer, the intermediate plating layer and the outer plating layer, and the frequency band, duty cycle and mean current density of the modulated current applied to the plating solution, are out of the above-described range, the manufacture efficiency of the completed products is lowered, and the fineness and flatness of the plating layer structure are deteriorated, so that the quality requirements of a pre plated lead frame for a semiconductor device cannot be satisfied.

Preferably, the overall thickness of the lead frame according to the present invention is about 0.30025 to about 3.6 µm.

A process for manufacturing a lead frame having the stacked structure shown in FIG. 5 will now be described.

First, an underlying metal for a lead frame comprising at least one metal among Cu, Cu alloy and Fe-Ni alloy, is continuously supplied by a reel-to-reel method. Otherwise, an underlying metal is supplied one by one in a batch type. Then, pre-treatment such as degreasing, pickling or washing is performed on the supplied underlying metal. Then, the pre treated underlying metal is submerged in a Ni plating solution and then a DC or modulated current, that is, a current having a waveform whose polarity is periodically inverted, is applied to the plating solution, thereby forming a Ni or Ni-alloy plated layer on at least one surface of the underlying metal. Here, a conventional Ni or Ni-alloy plating solution is used as the Ni plating solution. A representative Ni plating solution contains $NiSO_4$. The current applied to the Ni plating solution is modulated by a rectifier and has a frequency band of about 100 to about 20000 Hz and a duty cycle of about 5 to about 80%. The means current density is about 15 to about 35 $A/dM^2$.

If the Ni plated layer forming step is completed, an intermediate plating layer forming step in which Pd or Pd alloy is plated on the Ni plated layer, is performed. Here, usable Pd or Pd alloy plating bath includes a dichlorotetraamine palladium ($Pd(NH_3)_4Cl_2$) plating solution, a non ammonia plating solution and the like.

Here, the plating current is a modulated current having a frequency band of about 1000 to about 20000 Hz and a duty cycle of about 5 to about 45%, and the mean current density is about 0.1 to about 3 $A/dM^2$.

After the intermediate plating layer formation is completed, an outer plating layer forming step in which Ag or Ag alloy is plated on the intermediate plating layer, is performed. Usable Ag or Ag-alloy plating baths include a KAg(CN) plating solution, a non-cyan plating solution and the like. Here, a modulated current or DC current is applied to form an Ag plated layer on the Pd plated layer, and a preferred mean current density is about 1 to about 5 A/dM$^2$.

After forming the outer plating layer, post treatment such as pickling or washing may be performed, thereby completing a lead frame pre plating process.

Figure 6B:
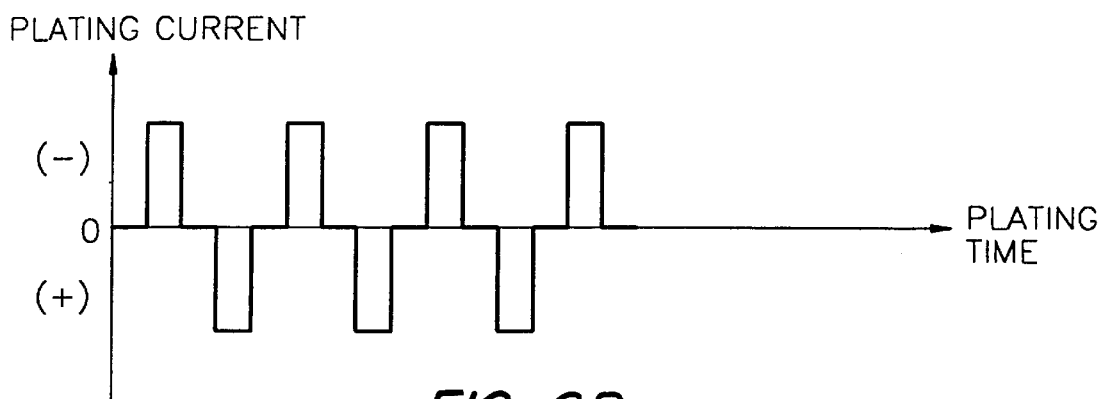
Figure 6C:
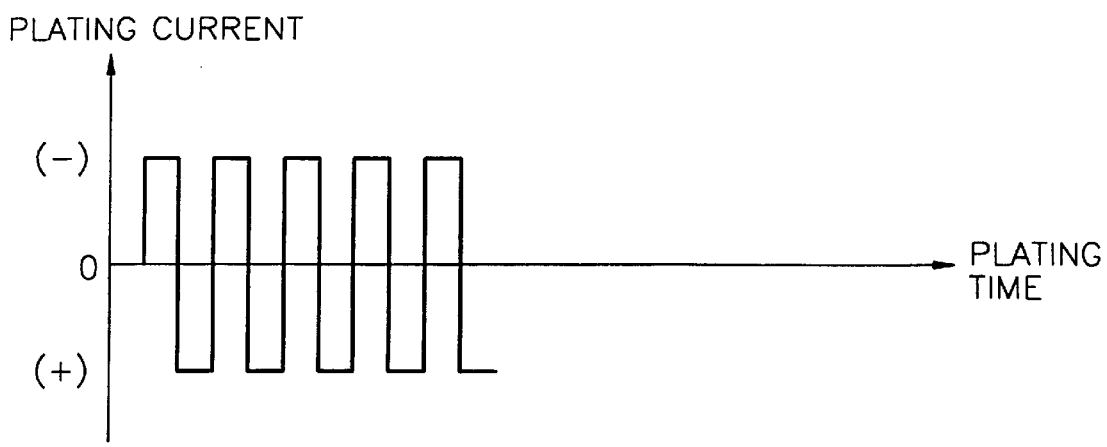
Figure 6D:
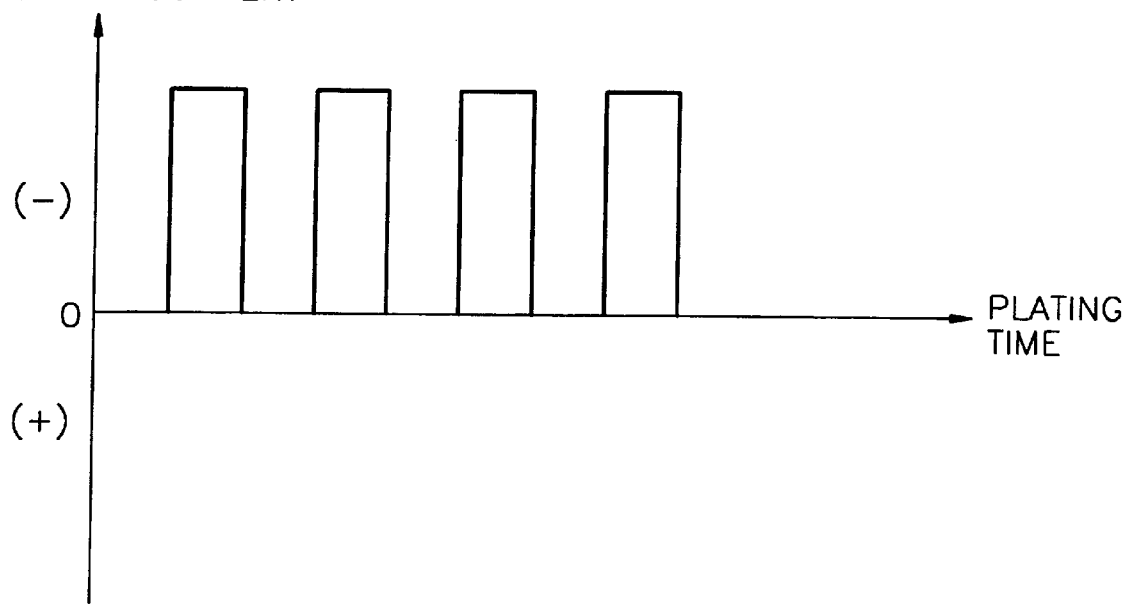
Figure 6E:
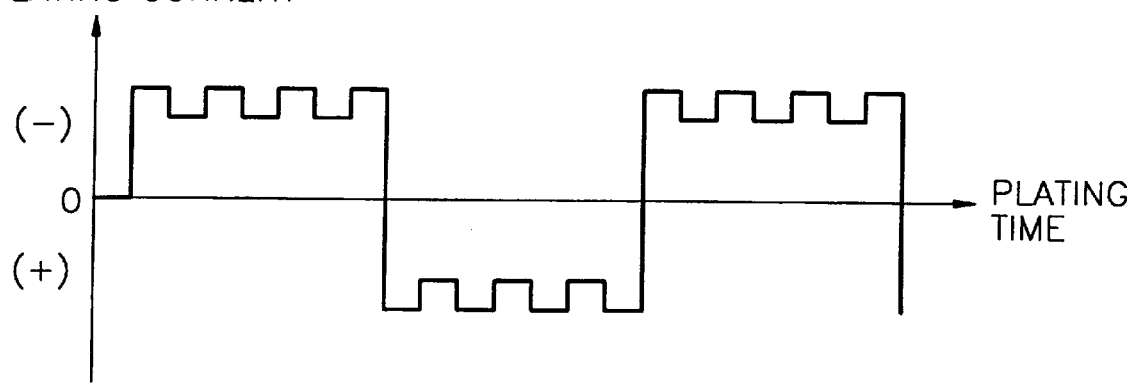

Preferred examples of the modulated current applied to the Ni plating bath, the Pd plating bath and the Ag plating bath, include a square wave pulse current in which a constant number of pulse waves are repeated and a constant number of inversion pulses are repeated as shown in FIG. 6A, a square wave pulse current whose polarity is periodically inverted at predetermined time intervals as shown in FIG. 6B, a square wave pulse current whose polarity is inverted as shown in FIG. 6C, a square wave pulse current in which a pulse current having a predetermined period is repeated with a predetermined time of delay without polarity inversion, as shown FIG. 6D, and a square wave pulse current in which a pulse is repeated with a short time of delay and whose polarity is periodically inverted as shown in FIG. 6E.

Figure 7:
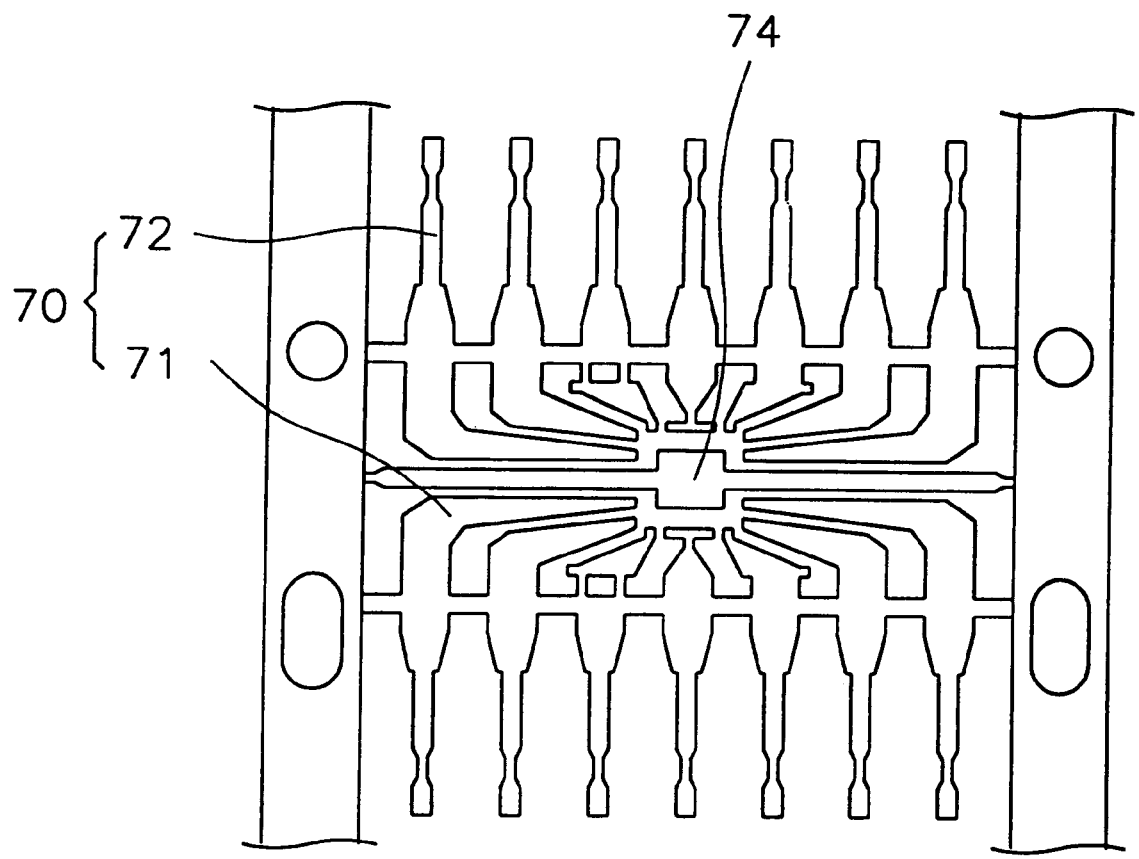
FIG. 7 is a plan view of the lead frame according to the present invention.

FIG. 7 shows a semiconductor lead frame according to an embodiment of the present invention. Referring to FIG. 7, the semiconductor lead frame includes a plurality of leads to comprising a plurality of inner leads 71, and a plurality of outer leads 72 connected to the respective inner leads 71. Die pad 74 for mounting a semiconductor chip, is provided in the central portion surrounded by the inner leads 71. Also, a Ni or Ni alloy plated layer as an underlying plating layer is formed on at least one surface of the lead frame. Also, a Pd or Pd alloy plated layer as an intermediate plating layer is formed on the underlying plating layer. Then, an Ag or Ag alloy plated layer is formed as the outer plating layer.

The present invention will be described in more detail below with reference to the following Examples and Comparative Examples.

EXAMPLES 1–5

During plating Ni, Pd and Ag, the current conditions are as follows.

In the case of plating Ni, the frequency band, the duty cycle and the mean current density are set to 100 Hz, 60% and 20 A/dM$^2$, respectively. In the case of plating Pd, the frequency band, the duty cycle and the mean current density are set to 2000 Hz, 20% and 0.5 A/dM$^2$, respectively. In the case of plating Ag, a DC current is used and the mean current density is set 1.5 A/dM$^2$.

Plating was performed under the above-described current conditions, to obtain lead frames having plating layer structures demonstrated in Table 1.

For the obtained lead frames, physical properties such as wire bondability, solderability, molding adhesion, corrosion resistance, crack resistance and the like were evaluated in the following manner, and the evaluation results are shown in Table 1.

Comparative Examples 1–5

Semiconductor lead frames having plating layer structures described in Table 2 were manufactured by conventional methods. For the obtained lead frames, physical properties such as wire bondability, solderability, molding adhesion, corrosion resistance, crack resistance and the like were evaluated in the following manners, and the evaluation results are shown in Table 2.

Method of evaluating physical properties

In the Examples and Comparative Examples of the present invention, a DRAM device, a STSOP2 type package, 1.2 mil A-type Au wire, LME type epoxy, a Cu-based alloy lead frame, a thermoplastic lead-on-chip (LOC) tape were used.

(1) Wire bondability

This test is for evaluating adhesion strength between a bonding wire and a lead. An apparatus used for measuring the adhesion strength is SWB-1 OOG manufactured by Samsung Techwin Co., Ltd., Korea. The minimum and average force (gf) required until bonding is separated away from a portion as bonded after wire bonding, were measured using vibrating power of 80 to 100, pressing force of 80 to 100, time of 15 to 20, a capillary having a bottle neck of 70 μm, a 0.8 mil Au wire. The term "open" used herein means the number of samples having completely separated lead bonding portion, based on 48 samples applied to tests of standard tensile strength.

(2) Solderability

Plated lead was submerged in a lead bath of 235° C. for 2 seconds to then measure the strained degree of solder, before and after bending a lead portion. After most lead frames are packaged, cracks occur often after an outer lead portion is bent. Thus, the measurement after bending is more meaningful than before bending.

After heating at a temperature of 275° C. for 1 hour, steam aging was carried out at 95° C. for 8 hours.

In the solderability test, solderability was measured with an R-flux.

(3) Crack resistance

This test is for observing generation of cracks after thermal shock.

PCT (pressure cooker test): 120° C./2 atm/100% RH, TC. (temperature cycling): over 1000 times at −65° C. to 150° C.

(4) Molding adhesion

A lead is pulled in a state in which the lead frame is molded to measure load using equipment for testing the adhesion between the mold and the lead, that is, UTM (Universal Test Machine). The thermal loading conditions are as follows: storage 175° C./6 hours, 85° C./85% RH, 6 hours, IR 3 cyc (pre-heating temperature: 220° C., reflow soldering temperature: 240° C.)

(5) Corrosion resistance

Evaluation method: KSM 8012 neutral saline water spraying method

Concentration of NaCl: 40 g/l Pressure of compressed air: 1.2 kgf/cm$^2$;

Spray amount: 1.51 ml/80 cm$^2$/h; Temperature of air evaporator: 470° C.;

Temperature of saline water tank: 35° C., Temperature of test tub: 350° C.

The degree of occurrence of corrosion under saline water conditions was tested by a neutral saline water spraying method and indicated by "non corrosive," "slightly corrosive", and "severely corrosive."

In Tables 1 and 2, "MIN and AVG" mean the "minimum force" and "average force required until bonding is separated away from a portion as bonded after wire bonding, respectively. The test for evaluating adhesion strength between a bonding wire and lead is described previously under the heading "(1) Wire Bondability."

"OPEN" means the number of samples having a completely separated lead bonding portion, based on 48 samples subjected to tests of standard tensile strength, also described previously under the heading "(1) Wire Bondability."

"EMC" means "epoxy molding compound."

"Adhesion" means adhesive force between the lead and the epoxy molding formed on the lead, previously described under the heading "(4) Molding Adhesion."

ing leads, while having excellent wire bondability due to the intrinsic characteristic of the Au outer plating layer. Also, since the epoxy adhesion is weak, heel crack is generated at a wire bonding portion when thermal expansion and contraction are repeated, thereby impairing the long-term reliability of semiconductor products.

TABLE 1

| | | Example 1 | Example 2 | Example 3 | Example 4 | Example 5 | |
|---|---|---|---|---|---|---|---|
| Stacked Structure (microinch, and μM) | Outer plating layer | Ag (1u", 0.025 μM) | Ag (3u", 0.075 μM) | Ag (8u", 0.2 μM) | Ag (7u", 0.175 μM) | Ag (8u", 0.2 μM) | All underlying metals of lead frame are copper (CU) |
| | Intermediate to plating layer | Pd (0.5u", 0o.0125 μM) | Pd (0.5u", 0.0125 μM) | Pd (0.5u", 0.0125 μM) | Pd (0.3u", 0.0075 μM) | Pd (0.2u", 0.005 μM) | |
| | Underlying plating layer | Ni (25u", 0.625 μM) | Ni (25u", 0.625 μM) | Ni (25u", 0.625 μM) | Ni (25u", 0.625 μM) | Ni (25u", 0.625 μM) | |
| Wire Bondability | MIN | 1.55 | 4.87 | 5.28 | 6.32 | 5.84 | |
| | AVG | 2.89 | 6.85 | 7.12 | 7.12 | 6.89 | |
| | OPEN | 25/48 | 0/48 | 0/48 | 0/48 | 0/48 | |
| Solderability (%) | Before bending | 50 | 100% | 100% | 100% | 100% | |
| | After bending | non-wet | 97% | 98% | 98% | 98% | |
| EMC Adhesion | As molded | 36.1 ± 0.7 | 45.9 ± 0.39 | 50.9 ± 1.01 | 47.9 ± 0.7 | 49.7 ± 2.01 | |
| | After molding | 32.6 ± 2.9 | 47.2 ± 1.10 | 48.1 ± 0.31 | 45.1 ± 0.4 | 47.5 ± 1.2 | |
| Corrosion Resistance | | Slightly corrosive | Non-corrosive | Non-corrosive | Non-corrosive | Non-corrosive | |
| Crack Resistance | | 600–1000 cycles | Over 1000 cycles | Over 1000 cycles | Over 1000 cycles | Over 1000 cycles | |

TABLE 2

| | | Comparative Example 1 | Comparative Example 2 | Comparative Example 3 | Comparative Example 4 | Comparative Example 5 | |
|---|---|---|---|---|---|---|---|
| Stacked Structure (micro-inch, and μM) | 3rd plating layer | Pd (4u", 0.1 μM) | Pd (0.2u", 0.005 μM) | Ag 5u", 0.125 μM | Au (0.1u", 0.0025 μM) | Ag (0.4u", 0.01 μM) | All underlying metals of lead frame are copper (CU) |
| | 2nd plating layer | Ni (25u", 0.625 μM) | Ni (25u", 0.625 μM) | Ni 25u", 0.625 μM | Pd (0.5u", 0.0125 μM) | Pd (1.0u", 0.025 μM) | |
| | 1st plating layer | — | — | | Ni (25u", 0.625 μM) | Ni (25u", 0.625 μM) | |
| Wire Bondability | MIN | — | — | | 6.79 | 6.89 | |
| | AVG | — | — | open | 7.6 | 7.25 | |
| | OPEN | — | 14/48 | | 0/48 | 0/48 | |
| Solderability (%) | Before bending | 80 | 60% | | 95.99% | 99% | |
| | After bending | non-wet | non-wet | non-wet | 60% | 60% | |
| EMC Adhesion | As molded | 30.6 ± 0.7 | — | — | 36.2 ± 0.52 | 29.2 ± 0.36 | |
| | After molding | 27.0 ± 2.9 | — | — | 32.5 ± 0.69 | 15.5 ± 0.31 | |
| Corrosion Resistance | | Slightly corrosive | Slightly corrosive | Severely corrosive | Slightly corrosive | Non-corrosive | |
| Crack Resistance | | ⁻cycles | ⁻600 cycles | ⁻600 cycles | ⁻600 cycles | ⁻600 cycles | |

Referring to Table 1, when a thin intermediate plating layer made of Pd or Pd alloy is formed between the underlying plating layer made of Ni or Ni alloy and the outer plating layer made of Ag or Ag alloy, the oxidation and diffusion of Ni can be prevented, thereby attaining excellent wire bondability and solderability. Here, the outer plating layer exhibited excellent solderability due to solderability which is the intrinsic property of metal, even under a high-temperature condition and even after soldering. Also, it proved that molding adhesion was excellent.

Referring to Table 2, when the Pd plated layer was formed on the Ni plated layer (Comparative Examples 1 and 2) or when only the Ag plated layer was thinly formed as the outer plating layer (Comparative Example 3), the underlying plating layer is weakly protected so that it is vulnerable to corrosion. Also, the Ni plated underlying layer is oxidized or is diffused into the outer plating layer to form a refractory oxide at the outermost layer, resulting in deterioration of wire bondability and solderability. In the case of plating Ag, it is difficult to directly plate Ag on the Ni plating layer.

When the Pd plated layer and the Au plated layer are sequentially formed on the Ni plated layer (Comparative Examples 4 and 5), the plated plane is so brittle that the solderability of the bending portion is lowered during bend- Conclusively, the lead frames manufactured by Examples 1 through 5 of the present invention, shows no corrosion occurred. That is to say, the lead frames have excellent corrosion resistance. Also, the molding adhesion of the lead frame according to the present invention is excellent, that is, substantially the same as that of a bare Cu substrate without a plating layer, and the crack resistance thereof is also excellent.

According to the present invention, the amount of a noble metal used for a pre plated lead frame can be greatly reduced, thereby noticeably reducing the material cost. Also, since the overall thickness of plating layers is markedly reduced, the lead frame according to the present invention can be suitably applied to thin-film semiconductor packages, by which a multi pin lead frame and lightweight semiconductor package can be attained. Further, since an Ag plated layer is formed as the outer plating layer, Ag migration can be prevented and excellent oxidation resistance and corrosion resistance can be exhibited even under a high temperature thermal condition. Also, due to excellent solderability of the Ag plated layer itself, the reliability of the semiconductor package can be improved. Also, the present invention can be advantageously applied to highly reliable semiconductor packaging due to excellent wire bondability and molding adhesion.

The various numerical ranges describing the invention as set forth throughout the specification also include any combination of the lower ends of the ranges with the higher ends of the ranges set forth herein, or any single experimental value or other single value set forth herein that will extend or reduce the scope of the lower limits of the range, or the higher limits of the range, where the ranges include, inter alia, ranges of time, temperature, concentrations of compounds, ratios of these compounds to one another, molecular or atomic species, molecular weights, pH, current density and the like, as well as all whole number and/or fractional number values encompassed by these ranges, and ranges encompassed within these ranges. The term "about" as it applies to individual numerical values, or numerical values stated in the ranges of the present specification means slight variations in these values.

Although the present invention has been described referring to Examples and Comparative Examples, those examples are just examples, and it will be understood by those skilled in the art that various modifications and other embodiments may be effected. Thus, the true scope of technical protection of the present invention must be determined by the technical spirit of the attached claims.

Although the present invention has been described with reference to illustrative embodiments, it should be understood that the invention is not limited to the illustrated embodiments, and that many changes and modifications can be made within the scope of the invention by a person skilled in the art.

What is claimed is:

1. A lead frame for a semiconductor package consisting of:
   a base metal layer made of copper (Cu), Cu alloy or iron-nickel (Fe—Ni) alloy;
   an underlying plating layer formed on at least one surface of the base metal layer and made of Ni or Ni alloy;
   an intermediate plating layer formed on the underlying plating layer to a thickness of about 0.00025 to about 0.1 μm (about 0.1 to about 4 microinches) and made of palladium (Pd) or Pd alloy; and
   an outer plating layer formed on the intermediate plating layer to a thickness of about 0.05 to about 0.75 μm (about 2 to about 30 microinches) and made of silver (Ag) or Ag alloy.

2. The lead frame according to claim 1, wherein the Ni alloy consists of about 80 to about 99.999 wt. % of Ni and about 0.001 to about 20 wt. % of phosphorus (P); the Pd alloy consists of about 80 to about 99.999 wt. % of Pd and about 0.001 to about 20 wt. % of at least one alloying element, wherein said alloying element is Au, Ag, Ru, Ni or P; and the Ag alloy consists of about 80 to about 99.999 wt. % of Ag and about 0.001 to about 20 wt. % of at least one alloying element wherein said alloying element is Pd, Au, Ru, Ni or P.

3. The lead frame according to claim 1, wherein the intermediate plating layer is formed by applying a modulated current to a plating bath.

4. The lead frame according to claim 3, wherein the Ni alloy consists of about 80 to about 99.999 wt. % of Ni and about 0.001 to about 20 wt. % of phosphorus (P); the Pd alloy consists of about 80 to about 99.999 wt. % of Pd and about 0.001 to about 20 wt. % of at least one alloying element, wherein said alloying element is of Au, Ag, Ru, Ni or P; and the Ag alloy consists of about 80 to about 99.999 wt. % of Ag and about 0.001 to about 20 wt. % of at least one alloying element, wherein said alloying element is Pd, Au, Ru, Ni or P.

5. The lead frame according to claim 3, wherein the underlying plating layer is formed by applying a modulated current to a plating bath containing Ni of Ni alloy, the modulated current having a frequency band of about 100 to about 20000 Hz, a duty cycle of about 5 to about 80% and a mean current density of about 15 to about 35 $A/dM^2$.

6. The lead frame according to claim 3, wherein the intermediate plating layer is formed by applying a modulated current to a plating bath containing Pd or Pd alloy, the modulated current having a frequency band of about 1000 to about 20000 Hz, a duty cycle of about 5 to about 45% and a mean current density of about 0.1 to about 3 $A/dM^2$.

7. The lead frame according to claim 3, wherein the outer plating layer is formed by applying a modulated current to a plating bath containing Ag of Ag alloy, the modulated current having a mean current density of about 1 to about 5 $A/dM^2$.

8. A lead frame for a semiconductor, consisting essentially of:
   a base metal layer made of copper (Cu), Cu alloy or iron-nickel (Fe—Ni) alloy;
   a first plating layer made of Ni of Ni alloy;
   a second plating layer made of palladium (Pd) or Pd alloy to a thickness of about 0.00025 to about 0.1 μm (about 0.1 to about 4 microinches); and
   a third plating layer made of silver (Ag) or Ag alloy to a thickness of about 0.05 to about 0.75 μm (about 2 to about 30 microinches).

9. The lead frame according to claim 8, wherein the Ni alloy consists essentially of about 80 to about 99.999 wt. % of Ni and about 0.001 to about 20 wt. % of phosphorous (P); the Pd alloy consists essentially of about 80 to about 99.999 wt. % of Pd and about 0.001 to about 20 wt. % of at least one alloying element selected from a group consisting of Au, Ag, Ru, Ni or P; and the Ag alloy consists essentially of about 80 to about 99.999 wt. % of Ag and about 0.001 to about 20 wt. % of at least one alloying element selected from a group consisting of Pd, Au, Ru, Ni of P.

10. The lead frame according to claim 8, wherein at least one of the first plating layer, the second plating layer and the third plating layer is formed by applying a modulated current to a plating bath.

11. The lead frame according to claim 10, wherein the waveform of the modulated current includes a square wave whose polarity is periodically inverted.

* * * * *